United States Patent
Commander et al.

(10) Patent No.: US 11,035,048 B2
(45) Date of Patent: Jun. 15, 2021

(54) COBALT FILLING OF INTERCONNECTS

(71) Applicant: MacDermid Enthone Inc., Waterbury, CT (US)

(72) Inventors: John Commander, Old Saybrook, CT (US); Kyle Whitten, Hamden, CT (US); Vincent Paneccasio, Jr., Madison, CT (US); Shaopeng Sun, Orange, CT (US); Eric Yakobson, Cheshire, CT (US); Jianwen Han, Waterbury, CT (US); Elie Najjar, Norwood, MA (US)

(73) Assignee: MacDermid Enthone Inc., Waterbury, CT (US)

( * ) Notice: Subject to any disclaimer, the term of this patent is extended or adjusted under 35 U.S.C. 154(b) by 0 days.

(21) Appl. No.: 15/641,756

(22) Filed: Jul. 5, 2017

(65) Prior Publication Data
US 2019/0010624 A1    Jan. 10, 2019

(51) Int. Cl.
*C25D 3/16* (2006.01)
*H01L 21/768* (2006.01)
*C25D 5/02* (2006.01)
*C25D 7/12* (2006.01)
*H01L 21/288* (2006.01)
(Continued)

(52) U.S. Cl.
CPC ............... *C25D 3/16* (2013.01); *C25D 3/18* (2013.01); *C25D 5/02* (2013.01); *C25D 7/00* (2013.01); *C25D 7/123* (2013.01); *H01L 21/2885* (2013.01); *H01L 21/76877* (2013.01); *H01L 21/76879* (2013.01)

(58) Field of Classification Search
CPC ... C25D 3/16; C25D 3/18; C25D 7/00; C25D 7/123; C25D 5/02; H01L 21/76877; H01L 21/2885; H01L 21/76879
See application file for complete search history.

(56) References Cited

U.S. PATENT DOCUMENTS

| | | |
|---|---|---|
| 3,306,831 A | 2/1967 | Cope, Jr. |
| 3,969,399 A * | 7/1976 | Passal ...................... C25D 3/12 562/101 |
| 4,439,283 A | 3/1984 | Verberne et al. |

(Continued)

FOREIGN PATENT DOCUMENTS

| | | | |
|---|---|---|---|
| DE | 1994549 | 3/1977 | |
| DE | 2642666 | * 3/1977 | ............... C25D 3/14 |

(Continued)

*Primary Examiner* — Louis J Rufo
(74) *Attorney, Agent, or Firm* — Carmody Torrance Sandak & Hennessey LLP

(57) ABSTRACT

Compositions and methods of using such compositions for electroplating cobalt onto semiconductor base structures comprising submicron-sized electrical interconnect features are provided herein. The interconnect features are metallized by contacting the semiconductor base structure with an electrolytic composition comprising a source of cobalt ions, a suppressor, a buffer, and one or more of a depolarizing compound and a uniformity enhancer. Electrical current is supplied to the electrolytic composition to deposit cobalt onto the base structure and fill the submicron-sized features with cobalt. The method presented herein is useful for superfilling interconnect features.

30 Claims, 2 Drawing Sheets

(51) Int. Cl.
    *C25D 3/18*    (2006.01)
    *C25D 7/00*    (2006.01)

(56)            References Cited

U.S. PATENT DOCUMENTS

| | | | | |
|---|---|---|---|---|
| 5,221,458 A * | 6/1993 | Herbert | ............... | C25D 1/04 |
| | | | | 119/215 |
| 9,574,280 B2 | 2/2017 | Ishikawa et al. | | |
| 9,777,386 B2 | 10/2017 | Doubina et al. | | |
| 2005/0173254 A1* | 8/2005 | Bokisa | ............... | C25D 3/562 |
| | | | | 205/255 |
| 2005/0230262 A1* | 10/2005 | Chen | ............... | C23C 18/165 |
| | | | | 205/122 |
| 2006/0213780 A1* | 9/2006 | Shih | ............... | C25D 3/02 |
| | | | | 205/296 |
| 2008/0202922 A1* | 8/2008 | Zhong | ............... | C23C 18/1669 |
| | | | | 204/273 |
| 2009/0035940 A1* | 2/2009 | Richardson | ............... | C25D 3/38 |
| | | | | 438/674 |
| 2009/0188805 A1* | 7/2009 | Moffat | ............... | C25D 3/12 |
| | | | | 205/119 |
| 2010/0304172 A1* | 12/2010 | Facchini | ............... | C25D 3/12 |
| | | | | 428/551 |
| 2011/0136449 A1* | 6/2011 | Zhu | ............... | H04B 17/102 |
| | | | | 455/115.2 |
| 2011/0163449 A1* | 7/2011 | Kelly | ............... | H01L 21/2885 |
| | | | | 257/750 |
| 2012/0018310 A1* | 1/2012 | Roeger-Goepfert | .... | C23C 18/31 |
| | | | | 205/118 |
| 2016/0273117 A1* | 9/2016 | Doubina | ............... | C25D 3/12 |
| 2019/0226107 A1* | 7/2019 | Kienle | ............... | H01L 21/76879 |

FOREIGN PATENT DOCUMENTS

| | | |
|---|---|---|
| JP | 62-278292 A | 12/1987 |
| JP | 63-114997 A | 5/1988 |
| KR | 1020140092855 | 7/2014 |
| TW | 201704551 | 2/2017 |
| WO | 2017/004424 A1 | 1/2017 |
| WO | WO/2018/015168 | 1/2018 |

* cited by examiner

COBALT FILLING OF INTERCONNECTS

FIELD OF THE INVENTION

The compositions and processes described herein generally relate to electrolytic deposition chemistry and methods for depositing cobalt and cobalt alloys. These compositions and methods are used for cobalt-based metallization of interconnect features in semiconductor substrates.

BACKGROUND OF THE INVENTION

In damascene processing, electrical interconnects are formed in an integrated circuit substrate by metal-filling of interconnect features such as vias and trenches, formed in the substrate. Copper is a preferred conductor for electronic circuits. Unfortunately, when copper is deposited on silicon substrates it can diffuse rapidly into both the substrate and dielectric films (such as $SiO_2$ or low k dielectrics). Copper also has a tendency to migrate from one location to another when electrical current passes through interconnect features in service, creating voids and hillocks. Copper can also diffuse into a device layer that is built on top of a substrate in a multilayer device application. Such diffusion can be detrimental to the device because it can damage an adjacent interconnect line and/or cause electrical leakage between two interconnects. Electrical leakage can result in an electrical short and the corresponding diffusion out of the interconnect feature can disrupt electrical flow.

In recent years, along with the reduction in size and desired increase in the performance of electronic devices, the demand for defect free and low resistivity interconnects in the electronic packaging industry has become critical. As the density of an integrated circuit within a mircroelectronic device continues to increase with each generation or node, interconnects become smaller and their aspect ratios generally increase. The build-up process, using barrier and seed layers, prior to damascene copper electroplating, now suffers from disadvantages that are becoming more evident as the demand for higher aspect ratio features and higher quality electronic devices increases. As a result, there is a need for more suitable plating chemistry to enable defect free metallization.

When submicron vias and trenches are filled by electrolytic deposition of copper, it is generally necessary to first deposit a barrier layer on the walls of the cavity to prevent the diffusion and electromigration of copper into the surrounding silicon or dielectric structure. In order to establish a cathode for the electrodeposition, a seed layer is deposited over the barrier layer. Barrier and seed layers can be very thin, especially where the electroplating solution contains a proper formulation of accelerators, suppressors, and levelers. However, as the density of electronic circuitry continues to increase, and the entry dimensions of vias and trenches become ever smaller, even very thin barrier and seed layers progressively occupy higher fractions of the entry dimensions. As the apertures reach dimensions below 50 nm, especially less than 40 nm, 30 urn, 20 nm, or even less than 10 nm (8 or 9 nm), it becomes increasingly difficult to fill the cavity with a copper deposit that is entirely free of voids and seams. The most advanced features have bottom widths of only 2-3 nm, a middle width of about 4 nm, and a depth of 100 to 200 nm, translating to an aspect ratio of between about 25:1 and about 50:1.

Electrolytic deposition of cobalt is performed in a variety of applications in the manufacture of microelectronic devices. For example, cobalt is used in capping of damascene copper metallization employed to form electrical interconnects in integrated circuit substrates. However, because cobalt deposits have higher resistivity, such processes have not previously offered a satisfactory alternative to electrodeposition of copper in filling vias or trenches to provide the primary interconnect structures.

SUMMARY OF THE INVENTION

Described herein are compositions that are useful for the electrolytic deposition of cobalt. The electrolytic compositions comprise: a source of cobalt ions; a suppressor compound; a buffering agent; optionally a uniformity enhancer; and optionally a depolarizing compound. The compositions described herein are useful for electrodeposition of cobalt, wherein the composition is essentially free of divalent sulfur compounds.

Such compositions are used in a process for filling a submicron cavity in a dielectric material wherein the cavity has a wall region comprising a contact material, the process comprising contacting a dielectric material comprising the cavity with an electrolytic cobalt plating composition under conditions effective to deposit cobalt on the wall regions, wherein the cobalt plating composition comprises a source of cobalt ions, a suppressor compound, a uniformity enhancer, a buffering agent, and one or more of a depolarizing compound and a uniformity enhancer. The composition may further include a compound that functions as a stress reducer.

The composition of the current invention can be summarized as a composition for the electrolytic deposition of cobalt comprising:
  a source of cobalt ions;
  a suppressor compound;
  a buffering agent; and
  one or more of a depolarizing compound and a uniformity enhancer;
  wherein the composition is at least substantially free of divalent sulfur compounds.

Further described are methods for filling submicron features of a semiconductor integrated circuit device by electrodeposition using the compositions described herein.

The method of the current invention can be summarized as a method for electroplating a cobalt deposit onto a semiconductor base structure, wherein the semiconductor base structure comprises a metallizing substrate comprising submicron-sized electrical interconnect features, the method comprising the steps of:
  a) contacting the metallizing substrate with an electrolytic composition comprising:
    a source of cobalt ions;
    a suppressor compound;
    a buffering agent; and
    one or more of a depolarizing compound and a uniformity enhancer; and
    wherein the composition is at least substantially free of divalent sulfur compounds; and
  b) supplying electrical current to the electrolytic composition to deposit cobalt onto the base structure and fill the submicron-sized electrical interconnect features with cobalt.

DETAILED DESCRIPTION OF THE PREFERRED EMBODIMENTS

Figure 1:
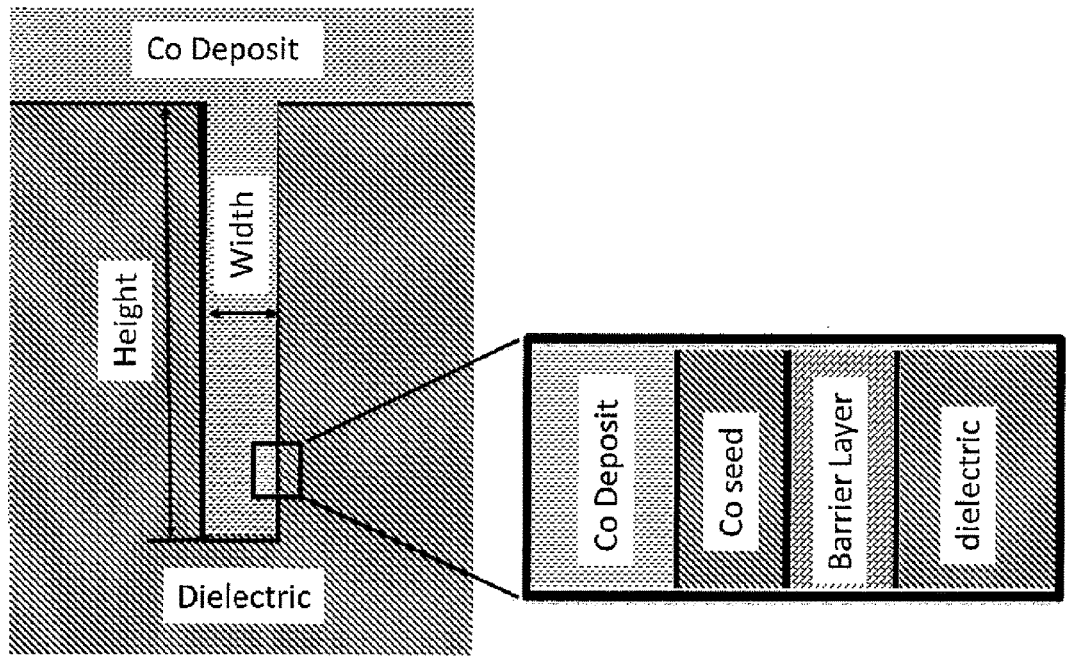
FIG. 1 shows a schematic illustration of a cobalt filled feature prepared by the method of the current invention.
Figure 2:
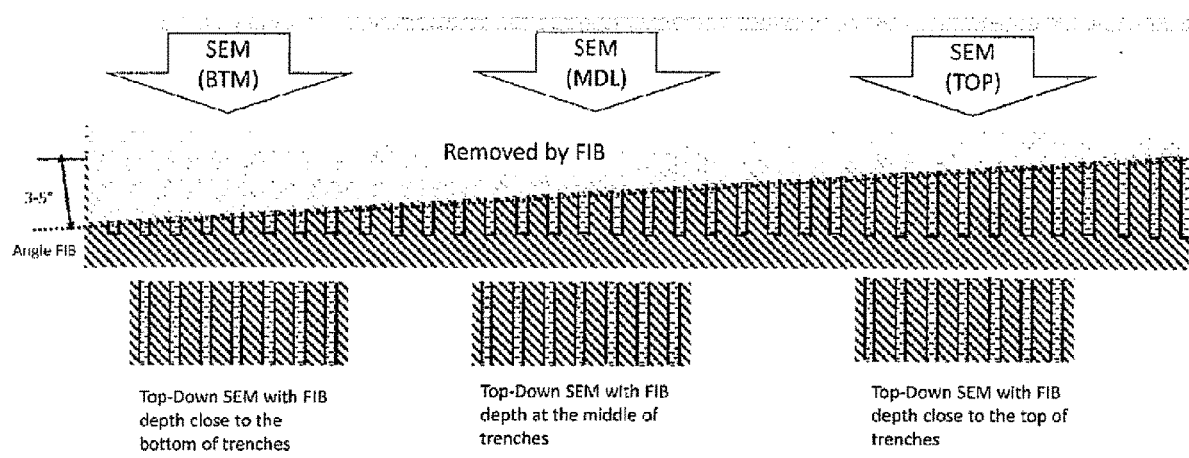
FIG. 2 shows a schematic illustration demonstrating how an angle cut cross-section is taken using a conventional focus ion beam/scanning electron microscope technique. This technique is used to analyze the plating in the interconnect features.

Cobalt-based electrolytic plating compositions and methods have been developed for use in electrolytic deposition of cobalt as an alternative to copper in the manufacture of semiconductor integrated circuit devices. More particularly, the compositions and methods of the invention are effective for filling submicron features of such devices.

The cobalt-based plating compositions described herein contain a source of cobalt ions. Although various cobaltous salts can be used, $CoSO_4$ is highly preferred. One source of cobaltous ions is cobalt sulfate heptahydrate. The composition is formulated with a cobalt salt in a concentration which is sufficient to provide between about 1 and about 50 g/L of $Co^{+2}$ ions, preferably between about 2 and about 10 g/L, and more preferably between about 2 and about 5 g/L.

The composition comprises one or more suppressor compounds which preferably comprises acetylenic alcohol compounds or derivatives thereof. One preferred suppressor is ethoxylated propargyl alcohol. Other preferred suppressor compounds include, but are not limited to, propargyl alcohols, ethoxylated propargyl alcohols, propoxylated propargyl alcohols, ethoxylated, propoxylated propargyl alcohols, a reaction product of ethoxylated propargyl alcohol and 1,4-butanediol diglycidyl ether, diethylene glycol bis(2-propynyl) ether, 1,4-bis(2-hydroxyethoxy)-2-butyne, 2-butyne-1,4-diol, 4-pentyne-1-ol, 2-methyl-3-butyne-2-ol, 3-methyl-1-pentyne-3-ol, 3-butyne-2-ol, and combinations of one or more of the foregoing. The concentration of the suppressor is preferably between about 1 and about 250 mg/L, and more preferably between about 10 and about 70 mg/L, and most preferably between about 20 and about 50 mg/L.

The composition may comprise one or more uniformity enhancing compounds which preferably comprise aminic polyol compounds or derivatives thereof. A preferred uniformity enhancer is ethoxylated, propoxylated triisopropanolamine. In one embodiment, the uniformity enhancer has a molecular weight of about 5000 g/mol. Other preferred uniformity enhancing compounds include ethoxylated, propoxylated ethylene diamine, ethoxylated, propoxylated diethylene triamine and ethoxylated, propoxylated triethylenetetramine. The concentration of the uniformity enhancer is preferably between about 10 and about 4000 mg/L, and more preferably between about 100 and about 2000 mg/L, and most preferably between about 250 and about 1000 mg/L.

The composition may comprise one or more depolarizing compounds. In one embodiment the one or more depolarizing compounds comprises terminal unsaturated compounds or derivatives thereof. These compounds are capable of depolarizing the plating potential. In one embodiment, the depolarizing compound may be selected from the group consisting of sodium propargyl sulfonate, acetylenedicarboxylic acid, acrylic acid, propiolic acid, vinyl phosphonate, and mixtures thereof. One preferred depolarizing compound is sodium propargyl sulfonate. The concentration of the depolarizing compound is preferably between about 0.1 and about 5000 mg/L, and more preferably between about 10 and about 1000 mg/L, and most preferably between about 100 and about 500 mg/L.

The electrolytic cobalt composition, also optionally, but preferably comprises a buffer to stabilize the pH. One preferred buffer is boric acid ($H_3BO_3$), which may be incorporated into the composition in a concentration between about 5 and about 50 g/L, preferably between about 15 and about 40 g/L. The pH of the composition is preferably maintained in the range of about 0.5 to about 8, preferably from about 2 to about 5.

The electrolytic composition described herein is also preferably substantially free of copper ions. Although very minor copper contamination may be difficult to avoid, it is particularly preferred that the copper ion content of the bath is no more than 20 ppb, e.g., in the range of 0.1 ppb to 20 ppb. This composition, as defined herein, is substantially free of copper ions when there are less than 20 ppb copper ions in solution.

The electrolytic composition is preferably free of any functional concentration of reducing agents that are effective to reduce cobaltous ions ($Co^2$) to metallic cobalt ($Co^0$). A functional concentration is defined herein as any concentration of an agent that either is effective to reduce cobaltous ions in the absence of electrolytic current or is activated by an electrolytic current or electrolytic field to react with cobaltous ions.

In one embodiment, the electrolytic composition comprises between about 1 and about 50 g/L cobalt ions; between about 1 and about 100 mg/L of a suppressor compound; optionally between about 10 mg/L and about 4000 mg/L of a uniformity enhancer; between about 5 mg/L and about 50 g/L buffer, and optionally a depolarizing compound between about 0.1 mg/L and about 1000 mg/L. The pH of the composition is preferably between about 1.5 and about 7.5, more preferably between about 2 and about 5.

In one embodiment, the electrolytic composition comprises between about 5 and about 10 g/L cobalt ions, between about 15 and about 65 mg/L of a suppressor selected from the group consisting of propargyl alcohol and ethoxylated propargyl alcohol, optionally between about 100 and about 1000 mg/L of the uniformity enhancer, between about 15 and about 40 g/L buffer, optionally a depolarizing compound between about 10 mg/L and 500 mg/L and the balance substantially water. The pH is preferably adjusted to a value between about 2.5 and about 3.5. Sulfuric acid is preferred for pH adjustment.

The electrolytic composition described herein can be used in a method for filling submicron features of a semiconductor base structure. The submicron features comprise cavities in the base structure that are superfilled by rapid bottom-up deposition of cobalt. A metallizing substrate comprising a seminal conductive layer is formed on the internal surfaces of the submicron features, e.g., by physical vapor deposition of metal seed layer, preferably a cobalt metal seed layer, or deposition of a thin conductive polymer layer. A submicron electrical interconnect feature has a bottom, sidewalls, and top opening. The metallizing substrate is applied to the bottom and sidewall, and typically to the field surrounding the feature. The metallizing substrate within the feature is contacted with the electrolytic composition and current is supplied to the electrolytic composition to cause electrodeposition of cobalt that fills the submicron features. By co-action of the suppressor, optional uniformity enhancer, and optional depolarizing compound, a vertical polarization gradient is formed in the feature in which filling will occur by bottom up deposition at a rate of growth in the vertical direction which is greater than a rate of growth in the horizontal direction, yielding a cobalt interconnect that is substantially free of voids and other defects.

To implement the electrodeposition method, an electrolytic circuit is formed comprising the metallizing substrate, an anode, the aqueous electrolytic composition, and a power source having a positive terminal in electrically conductive communication with the anode and a negative terminal in electrically conductive communication with the metallizing substrate. Preferably, the metallizing substrate is immersed in the electrolytic composition. An electrolytic current is delivered from the power source to the electrolytic composition in the circuit, thereby depositing cobalt on the metallizing substrate.

The electrodeposition process is preferably conducted at a bath temperature in the range of about 5° C. to about 80° C., more preferably between about 20° C. and about 50° C., and a current density in the range between about 0.01 and about 20 mA/cm$^2$, preferably between about 0.3 and about 10 mA/cm$^2$. Optionally, the current may be pulsed, which can provide improvement in the uniformity of the deposit. On/off pulses and reverse pulses can be used. Pulse plating may enable relatively high current densities, e.g., >8 mA/cm$^2$ during cobalt deposition.

Cold and hot entry methods can be used with this plating composition. Cold entry refers to starting the current after the electrode establishes contact with plating bath. Hot entry refers to starting the current at the moment when the electrode establishes contact with plating bath. In one embodiment, it was found that cold entry provides a favorable result.

In addition to using direct current, multi-plating step current and ramping current waveform can be used in the instant invention. Multi-plating step current waveform means that after open circuit time (no current), if cold entry is used, $i_1$ is applied for certain time, then $i_2$ is applied for certain time, then $i_n$ (n>1) is applied. Typically, $i_1$ is the smallest current density, and then current density gradually increases. Ramping current waveform means that after open circuit time, if cold entry is used, current density starts at $i_3$, and gradually increases to $i_2$ at changing rate, given in mA/cm$^2$s. A preferred current waveform is open circuit time for 10 seconds, 0.5 mA/cm$^2$ for 4 minutes and 2 mA/cm$^2$ for 2 minutes to fully fill the feature with 7 nm opening and 180 nm depth. If overplate of the via or trench is needed, another plating step at 10 mA/cm$^2$ for 60 seconds can be used to achieve 150 nm of overplate.

When divalent sulfur compounds are excluded from the plating bath, the sulfur content of the cobalt deposit is lowered, with consequent beneficial effects in chemical mechanical polishing and circuit performance.

The electrolytic composition is substantially free of divalent sulfur compounds if the concentration of divalent sulfur in the plating solution is not greater than 1 mg/l. Preferably, the concentration of compounds containing divalent sulfur atoms is not greater than 0.1 mg/l. Still more preferably, the concentration of divalent sulfur atoms is below the detection level using analytical techniques common to those skilled in the art of metal plating.

To reduce internal stress in the cobalt deposit, the electrolytic composition can include a stress reducer such as saccharin. When used, saccharin is present in the electrolytic composition in a concentration between about 10 and about 300 ppm, more preferably between about 100 and about 200 ppm.

It has been surprisingly discovered not only that submicron features can be effectively superfilled using compositions that are devoid of accelerators and other compounds that comprise divalent sulfur, but that cobalt can be effectively deposited from a plating bath that comprises no accelerator at all. When the plating bath contains a suppressor such as those described above, and a uniformity enhancer is described herein, the superfilling process proceeds satisfactorily without the need for an accelerator. The suppressors in the current invention help drive current into the features to make bottom-up filling efficient and the uniformity enhancing additives help improve deposit uniformity. The composition is substantially free of reducing agents that reduce Co$^{2+}$ to Co$^0$, divalent sulfur, copper ions, nickel ions and iron ions.

Figure 3:
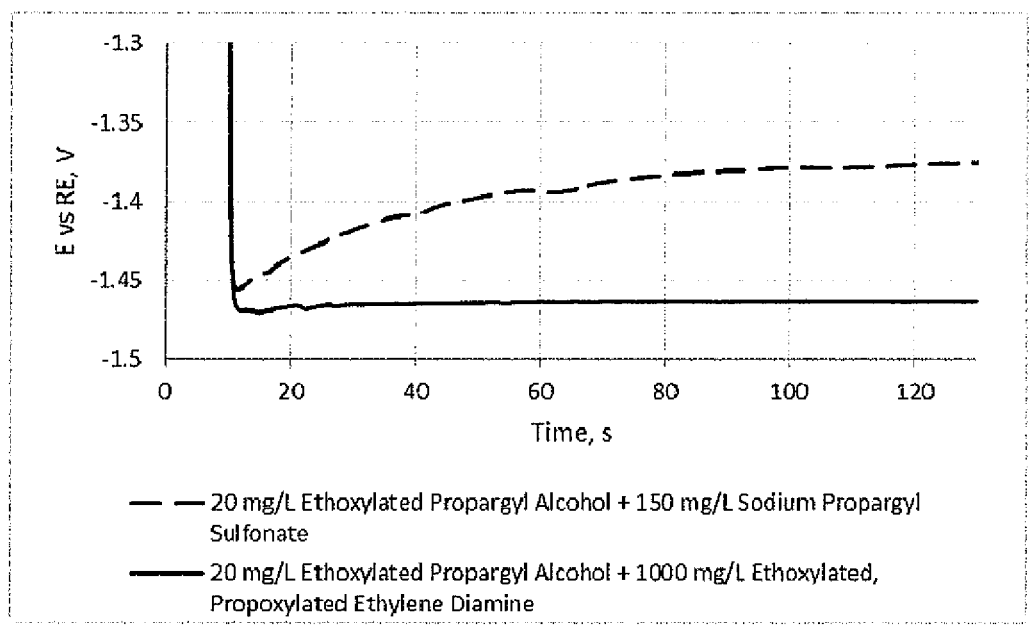
FIG. 3 shows polarization curves comparing ethoxylated propargyl alcohol and sodium propargyl sulfonate in cobalt VMS with ethoxylated propargyl alcohol and ethoxylated, propoxylated, ethylene diamine in cobalt VMS. The polarization curves show 20 mg/L ethoxylated propargyl alcohol+ 150 mg/L sodium propargyl sulfonate and 20 mg/L ethoxyglated propargyl alcohol+1000 mg/L ethoxylated, propoxylated ethylene diamine in the VMS (virgin makeup solution) comprising 2.95 g/L Co (Co ion concentration) and 30 g/L boric acid for 10 seconds with no current at the working electrode followed by 2 mA/cm$^2$ at 100 rpm and pH 3, wherein the working bath is degassed (dissolved oxygen <2 ppm).
Figure 4:
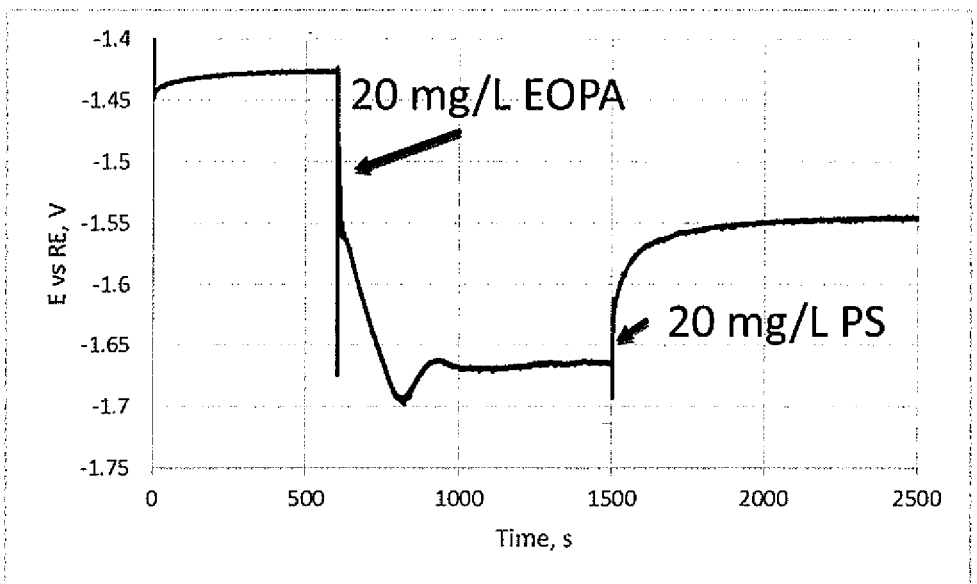
FIG. 4 shows polarization curves for separate injections of ethoxylated propargyl alcohol followed by sodium propargyl sulfonate into cobalt VMS. The VMS comprises 2.95 g/L co (Co ion concentration) and 30 g/L boric acid, has a pH of 3, a current density of 4 mA/cm$^2$, rotation rate of 1000 rpm, is degassed (dissolved oxygen <2 ppm), and operates at room temperature.

It has also been found that certain depolarizing compounds can function in conjunction with the suppressor compounds as described herein. These compounds depolarize the plating potential to efficiently plate interconnect features. FIGS. 3 and 4 demonstrate the capabilities of the depolarizing compounds in combination with the suppressor compounds described herein. FIG. 3 shows that ethoxylated propargyl alcohol and ethoxylated, propoxylated ethylene diamine have stable plating potential, but the combination of ethoxylated propargyl alcohol and sodium propargyl sulfonate have clear depolarization. The depolarization can benefit gap fill performance, with proper plating conditions, by driving more current into the trench. FIG. 4 shows the effects of separate injections of ethoxylated propargyl alcohol and sodium propargyl sulfonate in cobalt VMS, wherein the injection of ethoxylated propargyl alcohol at about 600 seconds causes polarization in potential for about 270 mV and the injection of sodium propargyl sulfonate at about 1500 seconds causes depolarization in potential for about 120 mV. Acetylenedicarboxylic acid, acrylic acid, vinyl phosphonate, and propiolic acid have been identified as having similar depolarization properties to sodium propargyl sulfonate.

Bottom-up fill means that deposit grows up from the bottom of features, like a trench. Bottom-up fill can be classified as V or U shaped. A V-shape bottom-up has a pointer bottom, and a U-shape bottom-up has more leveled bottom. U-shape bottom-up filling is preferred, as V-shape bottom-up filling can generate seams. Conformal fill means that a deposit grows from sidewalls and bottom to the center of features. The most challenging features usually have very large aspect ratios (aspect ratio is the ratio of depth over width), and conformal fill typically makes a seam at the center of such features. A seam can be vague or clear depending on fill mechanism. However, after annealing, any seam can make seam voids or center voids.

Uniformity of the cobalt deposit is an important requirement. However there is often a trade-off between gap fill and uniformity. The higher the suppressor concentration in a plating composition, the better the fill performance can be, but uniformity can often become worse. As a result, additives have been introduced into the composition to improve uniformity without any negative impact on fill performance, so that the operating window of the suppressor can be expanded. The results of using these uniformity enhancing additives and optional accelerating compounds in combination with the described suppressors provided unexpectedly efficient methods to superfill submicron-sized interconnect features with cobalt. Another benefit of using the uniformity enhancing additives is that it allows for wider operating ranges with respect to the suppressor concentration, the current density, rotation rate and other typically limited factors.

The novel compositions and methods are effective in the preparation of semiconductor integrated circuit devices comprising the semiconductor base structure and submicron interconnect features filled with cobalt. Providing cobalt interconnects is especially advantageous where the interconnect features have a width or diameter less than 100 nm and an aspect ratio of greater than 3:1. The attractiveness of cobalt increases as the size of the interconnect cavity decreases to 50 nm, 30 nm or below having aspect ratios of greater than 3:1, such as between 4:1 and 10:1 or higher. For example the method may be implemented to produce a semiconductor integrated circuit device comprising a semiconductor base structure having a plurality of cavities therein, wherein each cavity of such plurality of cavities has a width or diameter of not greater than 20 nm and is filled with cobalt by electrodeposition over a seminal conductive layer of a given thickness on the interior wall of the cavity. Cavities can be filled having entry dimensions (width or diameter) as small as 7 nm or even 4 nm and aspect ratios of greater than 15:1, greater than 20:1 or even greater than 30:1, for example, between 10:1 and 50:1, or between 15:1 and 50:1.

Because the use of cobalt allows a barrier layer to be dispensed with, the volume of cobalt with which a via or trench having a width or diameter of 20 nm or less may be filled substantially exceeds the volume of copper with which the same feature may be filled. For example, if the requisite thickness of the barrier layer under a copper deposit is 30 angstroms, the volume of cobalt (including, e.g., a 20 angstrom seed layer) with which a feature having a width or diameter of 20 nm or may be filled typically exceeds the volume of copper (also including a 20 angstrom seed layer) with which the same feature may be filled by at least 50%, more typically at least 100%. This relative difference increases as the size of the feature is further decreased.

The compositions and methods described herein enable cobalt filling of submicron features having an electrical resistance that is competitive with copper. For example, depending on the thickness of a barrier layer necessary to prevent diffusion and electromigration of copper, a cavity having a width or diameter (entry dimension) less than 15 nm may be filled with cobalt over a seminal conductive layer of a given thickness on an interior wall of the cavity in such volume that the cobalt filling has an electrical resistance not more than 20% greater than a reference filling provided by electrodeposition of copper over a seminal conductive layer of the same given thickness on the interior wall of a reference cavity of the same entry dimension as the cobalt filled cavity, wherein a barrier layer against copper diffusion underlies the seminal conductive layer in the reference cavity. For example, the thickness of the barrier layer may be at least 30 angstroms. At entry dimensions significantly lower than 15 nm and/or reference barrier layer thicknesses greater than 30 angstroms, the electrical resistance of the cobalt filling can be significantly less than the electrical resistance of the reference copper filling. The utility of the cobalt filling as measured by its resistance relative to a copper filling becomes most pronounced in features having a width or diameter not greater than 10 nm, or not greater than 7 nm.

The advantage of filling submicron interconnects with cobalt rather than copper can be illustrated by reference in FIG. 1. The narrow width of the via or trench is necessarily further narrowed by the need to provide a seminal conductive layer for electrodeposition of the metal that fills the interconnect feature. Where the feature is to be filled with copper, the available space within the feature is further diminished by the barrier layer indicated in FIG. 1, which is necessary to prevent diffusion of copper into the semiconductor substrate. However, where the feature is to be filled with cobalt, the barrier layer can be dispensed with, thereby materially increasing the volume available to be filled with metal. The use of a barrier layer may still be necessary if cobalt is used for filling small features that subsequently come in contact with copper plating baths, which are typically used to fill larger features. Copper can diffuse into a cobalt layer which can then allow the copper to diffuse into the dielectric. A barrier layer such as TiN is useful to prevent copper diffusion into the dielectric material if the cobalt layer will be subsequently exposed to copper plating baths.

A cobalt seed layer can typically be 0.1 to 40 nm thick. However, for features having a width below about 15 nm, it has been found feasible to provide a cobalt seed layer having a thickness of only about 1 nm at the side wall, about 4 nm at the bottom, and about 10 nm on the upper field surrounding the interconnect feature, thus preserving a maximum volume for the cobalt fill.

FIG. 1 shows a cobalt fill and deposit into a submicron feature having the space between the cobalt fill and the dielectric occupied by the metal seed layer which provides the seminal conductive layer for electrodeposition, and the optional barrier layer. There are other preferred embodiments where no such barrier layer is used. The barrier layer is essential when the feature is filled with copper, but not necessary where the feature is filled with cobalt in accordance with this invention.

A preferred product of the novel method comprises a semiconductor integrated circuit device comprising a semiconductor base structure having a plurality of cavities therein, wherein each cavity of such plurality of cavities has an entry dimension of not greater than 15 nm and is filled with cobalt over a seminal conductive layer of a given thickness on the interior wall of the cavity, e.g., at least 20 angstroms. The electrical resistance of the cobalt filling is not more than 20% greater than a reference filling provided by electrodeposition of copper over a seminal conductive layer of the same given thickness located over a barrier layer on the interior wall of a reference cavity of the same entry dimension, the barrier layer typically having a thickness of at least 30 angstroms. Preferably, each cavity of the plurality of cavities has an entry dimension of not greater than 12 nm, not greater than 9 nm, not greater than 8 nm, not greater than 7 nm or not greater than 4 nm, or between about 5 nm and about 15 nm. The aspect ratio of the cavities is at least about 3:1, at least about 4:1, at least about 15:1, at least about 20:1 or at least about 30:1, typically between about 10:1 and about 50:1.

In preferred embodiments of the semiconductor integrated circuit device, the electrical resistance of the cobalt filling is equal to or less than the resistance of the reference copper filling. Internal tensile stress in the cobalt filling is not greater than 500 MPa, typically between about 0 and about 500 MPa, or between 0 and about 400 MPa. The stress of the deposit is typically measured after annealing the deposit.

The following non-limiting examples illustrate the invention.

Example 1

An electrolytic cobalt deposition composition was prepared with the following components:

$Co^{2+}$ ions - 2.95 g/L
$H_3BO_3$ - 30 g/L
Ethoxylated propargyl alcohol - 20 mg/L
Tetronic 1307 (ethoxylated, propoxylated ethylene diamine) - 1000 mg/L
water to balance to 1 L
pH adjusted to 3.0

Example 2

An electrolytic cobalt deposition composition was prepared with the following components:

$Co^{2+}$ ions - 2.95 g/L
$H_3BO_3$ - 30 g/L
Ethoxylated propargyl alcohol - 50 mg/L
Tetronic 1307 (ethoxylated, propoxylated ethylene diamine) - 1000 mg/L
Vinylphosphonic acid - 200 mg/L
water to balance to 1 L
pH adjusted to 3.0

Example 3

An electrolytic cobalt deposition composition was prepared with the following components:

$Co^{2+}$ ions - 2.95 g/L
$H_3BO_3$ - 30 g/L
Ethoxylated propargyl alcohol - 50 mg/L
Sodium propargyl sulfonate - 200 mg/L
water to balance to 1 L
pH adjusted to 3.0

These compositions were used to fill a feature having a 12 nm top opening, a 7 nm middle width, a 2 nm bottom width, and a depth of 180 nm at a current density range of 0.1 mA/cm² to 20 mA/cm² with multi-step current waveform or ramping current waveform, followed by 5 mA/cm² to 20 mA/cm² for 0.5-2 minutes, at room temperature and a rotation rate of 20 to 200 rpm. The cold entry method was used for 0.5 to 30 seconds In all examples, void-free fill was achieved with good uniformity. Resistivity is an important factor wherein the current standard requires that deposits both with and without additives (VMS only) to have similar resistivity. Resistivity of the deposits plated in the examples above was similar to a deposit plated from VMS alone, without any additives. Total impurities of C, O, N, Cl and S were <5000 ppm by weight in deposit. These plating baths are low or sulfur-free compositions and can fill 7 nm openings with an aspect ratio of about 20 for trenches.

A main purpose of the invention described herein is to have seam-free and void-free fill with good uniformity and film properties. Film properties include acceptable stress, good resistivity and minimal impurities. Uniformity includes having uniform deposit thickness distribution over wafer, uniform local fill level and overplate (over isolated and densely placed structures) and smooth morphology.

When introducing elements of the present invention or the preferred embodiment(s) thereof, the articles "a", "an", "the" and "said" are intended to mean that there are one or more of the elements. The terms "comprising", "including" and "having" are intended to be inclusive and mean that there may be additional elements other than the listed elements. Substantially free and essentially free, if not otherwise defined above for a particular element or compound, means that a given element or compound is not detectable by ordinary analytical means that are well known to those skilled in the art of metal plating for bath analysis. Such methods typically include atomic absorption spectrometry, titration, UV-Vis analysis, secondary ion mass spectrometry, and other commonly available analytical methods.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As various changes could be made in the above without departing from the scope of the invention, it is intended that all matter contained in the above description and shown in the accompanying drawings shall be interpreted as illustrative and not in a limiting sense. The scope of invention is defined by the appended claims and modifications to the embodiments above may be made that do not depart from the scope of the invention.

The invention claimed is:
1. A composition for the electrolytic deposition of cobalt and configured for filling submicron features of a semiconductor base structure, the composition comprising:
a source of cobalt ions;
a suppressor compound, wherein the suppressor compound comprises an acetylenic suppressor selected from the group consisting of propoxylated propargyl alcohol, a reaction product of ethoxylated propargyl alcohol and 1,4-butanediol diglycidyl ether, diethylene glycol bis(2-propynyl) ether, 4-pentyne-1-ol, 2-methyl-3-butyne-2-ol, 3-methyl-1-pentyne-3-ol, 3-butyne-2-ol, and combinations of one or more of the foregoing;
a buffering agent; and
a uniformity enhancer, wherein the uniformity enhancer comprises an aminic polyol compound or a derivative thereof;
wherein the composition does not contain an accelerator;
wherein the composition has a concentration of divalent sulfur compounds of less than 1 mg/l;
wherein the composition is free of nickel ions, and wherein the composition is configured for electrodepositing cobalt with total impurities of C, O, N, Cl and S less than 5000 ppm by weight in deposit;

wherein the presence of the uniformity enhancer in the composition improves uniformity without a negative effect on fill performance such that the cobalt electrodeposit exhibits a uniform deposit thickness distribution and smooth morphology and promotes a seam-free, void-free cobalt electrodeposit in the submicron features.

2. A composition according to claim 1, wherein the composition is free of any functional concentration of reducing agents that are capable of reducing cobaltous ions ($Co^{2+}$) to metallic cobalt ($Co^0$).

3. A composition according to claim 1 further comprising a stress reducer, wherein the stress reducer comprises saccharin.

4. A composition according to claim 3, wherein the stress reducer comprises saccharin at a concentration of between about 10 and about 300 ppm.

5. A composition according to claim 1, wherein the buffering agent comprises boric acid.

6. A composition according to claim 1, wherein the pH is between about 1.5 and about 7.

7. A composition according to claim 6, wherein the pH is between about 2.5 and about 3.5.

8. A composition according to claim 1, consisting essentially of:
   between about 1 and about 50 g/L cobalt ions;
   between about 1 and about 100 mg/L of the suppressor compound;
   between about 10 and about 4000 mg/L of the uniformity enhancer;
   between about 5 and about 50 g/L of the buffering agent; and
   the balance substantially water.

9. A composition according to claim 8, consisting essentially of:
   between about 5 and about 10 g/L cobalt ions;
   between about 15 and about 65 mg/L of the suppressor;
   between about 100 and about 1000 mg/L of the uniformity enhancer;
   between about 15 and about 40 g/L of the buffering agent; and
   the balance substantially water.

10. A composition according to claim 1 comprising less than about 20 ppb copper ions.

11. A composition according to claim 1, wherein the uniformity enhancer is selected from the group consisting of ethoxylated, propoxylated triisopropanolamine, ethoxylated, propoxylated ethylene diamine, ethoxylated, propoxylated diethylene triamine, ethoxylated, propoxylated triethylenetetramine and combinations of one or more of the foregoing.

12. A composition according to claim 1, wherein the composition further comprises a depolarizing compound selected from the group consisting of sodium propargyl sulfonate, acetylenedicarboxylic acid, acrylic acid, propiolic acid, and mixtures thereof.

13. A composition according to claim 12, wherein the depolarizing compound comprises sodium propargyl sulfonate.

14. A composition for the electrolytic deposition of cobalt and configured for filling submicron features of a semiconductor base structure, the composition comprising:
   a source of cobalt ions;
   a suppressor compound, wherein the suppressor compound comprises an acetylenic suppressor selected from the group consisting of propoxylated propargyl alcohol, a reaction product of ethoxylated propargyl alcohol and 1,4-butanediol diglycidyl ether, diethylene glycol bis(2-propynyl) ether, 4-pentyne-1-ol, 2-methyl-3-butyne-2-ol, 3-methyl-1-pentyne-3-ol, 3-butyne-2-ol, and combinations of one or more of the foregoing;
   a buffering agent;
   a depolarizing compound selected from the group consisting of sodium propargyl sulfonate, acetylenedicarboxylic acid, acrylic acid, propiolic acid, and mixtures thereof; and
   a uniformity enhancer, wherein the uniformity enhancer comprises an aminic polyol compound or a derivative thereof;
   wherein the composition does not contain an accelerator;
   wherein the composition has a concentration of divalent sulfur compounds of less than 1 mg/l; and
   wherein the composition is free of nickel ions, wherein the composition is capable of electrodepositing cobalt with total impurities of C, O, N, Cl and S less than 5000 ppm by weight in deposit.

15. A composition for the electrolytic deposition of cobalt and configured for filling submicron features of a semiconductor base structure, the composition comprising:
   a source of cobalt ions;
   an acetylenic suppressor compound;
   a buffering agent; and
   a uniformity enhancer, wherein the uniformity enhancer comprises ethoxylated, propoxylated triisopropanolamine;
   wherein the composition does not contain an accelerator;
   wherein the composition has a concentration of divalent sulfur compounds of less than 1 mg/l;
   wherein the composition is free of nickel ions, and
   wherein the composition is configured for electrodepositing cobalt with total impurities of C, O, N, Cl and S less than 5000 ppm by weight in deposit;
   wherein the presence of the uniformity enhancer in the composition improves uniformity without a negative effect on fill performance such that the cobalt electrodeposit exhibits a uniform deposit thickness distribution and smooth morphology and promotes a seam-free, void-free cobalt electrodeposit in the submicron features.

16. The composition according to claim 15, wherein the acetylenic suppressor comprise ethoxylated propargyl alcohol.

17. A method for electroplating a cobalt deposit onto a semiconductor base structure, wherein the semiconductor base structure comprises a metallizing substrate comprising submicron-sized electrical interconnect features, the method comprising the steps of:
   a) contacting the metallizing substrate with an electrolytic composition comprising:
      a source of cobalt ions;
      a suppressor compound, wherein the suppressor compound comprises an acetylenic suppressor selected from the group consisting of propoxylated propargyl alcohol, a reaction product of ethoxylated propargyl alcohol and 1,4-butanediol diglycidyl ether, diethylene glycol bis(2-propynyl) ether, 4-pentyne-1-ol, 2-methyl-3-butyne-2-ol, 3-methyl-1-pentyne-3-ol, 3-butyne-2-ol, and combinations of one or more of the foregoing;
a buffering agent; and
a uniformity enhancer, wherein the uniformity enhancer comprises an aminic polyol compound or a derivative thereof;
wherein the composition does not contain an accelerator or a depolarizing compound;
wherein the composition has a concentration of divalent sulfur compounds of less than 1 mg/l, and
wherein the composition is free of nickel ions; and
b) supplying electrical current to the electrolytic composition to deposit cobalt onto the semiconductor base structure and superfill the submicron-sized electrical interconnect features with cobalt by bottom-up deposition, wherein the cobalt deposit is seam-free in the submicron-sized electrical interconnect features,
wherein the cobalt deposit has total impurities of C, O, N, Cl and S less than 5000 ppm by weight in deposit.

18. The method according to claim 17, wherein the electrolytic composition is free of any functional concentration of reducing agents capable of reducing cobaltous ions ($Co^{2+}$) to metallic cobalt ($Co^0$).

19. The method according to claim 17, wherein the electrolytic composition is free of copper ions, and iron ions.

20. The method according to claim 17, wherein the uniformity enhancer is selected from the group consisting of ethoxylated, propoxylated triisopropanolamine, ethoxylated, propoxylated ethylene diamine, ethoxylated, propoxylated diethylene triamine, ethoxylated, propoxylated triethylenetetramine and combinations of one or more of the foregoing.

21. The method according to claim 17, wherein the electrolytic composition has a pH between about 1.5 and about 7.

22. The method according to claim 21, wherein the electrolytic composition has a pH between about 2.5 and about 3.5.

23. The method according to claim 17, wherein the electrolytic composition further comprises a stress reducer, wherein the stress reducer comprises saccharin in a concentration between about 10 and about 300 ppm.

24. The method according to claim 17, wherein the bottom-up deposition proceeds at a rate of growth in a vertical direction towards an entry to the submicron-sized electrical interconnect features which is greater than a rate of growth in a horizontal direction perpendicular to the vertical direction.

25. The method according to claim 17, wherein internal tensile stresses in the cobalt filling the submicron-sized electrical interconnect features are between about 0 and about 500 MPa.

26. The method according to claim 17, wherein an entry dimension of the submicron-sized electrical interconnect features is less than about 50 nm.

27. The method according to claim 26, wherein the submicron-sized electrical interconnect features have an aspect ratio of greater than about 3:1 or greater than about 4:1 or between about 4:1 and about 10:1.

28. The method according to claim 26, wherein the submicron-sized electrical interconnect features have an aspect ratio of greater than about 15:1, or greater than about 20:1, or greater than about 30:1 or between about 10:1 and about 50:1.

29. The method according to claim 17, wherein a depolarizing compound is present and is selected from the group consisting of sodium propargyl sulfonate, acetylenedicarboxylic acid, acrylic acid, propiolic acid, and mixtures thereof.

30. The method according to claim 29, wherein the depolarizing compound comprises sodium propargyl sulfonate.

* * * * *